United States Patent
Tang et al.

(10) Patent No.: US 7,397,274 B1
(45) Date of Patent: Jul. 8, 2008

(54) IN-SYSTEM PROGRAMMING OF A NON-COMPLIANT DEVICE USING MULTIPLE INTERFACES OF A PLD

(75) Inventors: Howard Tang, San Jose, CA (US); Satwant Singh, Fremont, CA (US); San-Ta Kow, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 145 days.

(21) Appl. No.: 11/100,718

(22) Filed: Apr. 7, 2005

(51) Int. Cl.
*H03K 19/00* (2006.01)
*G01R 31/28* (2006.01)

(52) U.S. Cl. ............... 326/40; 326/16; 326/46; 714/726

(58) Field of Classification Search ........... 326/16, 326/37, 38, 39, 40, 41, 46, 47; 714/725, 714/726
See application file for complete search history.

(56) References Cited

U.S. PATENT DOCUMENTS

| | | | |
|---|---|---|---|
| 5,794,033 A | 8/1998 | Aldebert et al. | |
| 6,038,185 A | 3/2000 | Ng et al. | |
| 6,044,025 A | 3/2000 | Lawman | |
| 6,507,214 B1 | 1/2003 | Snyder | |
| 6,564,285 B1 | 5/2003 | Mills et al. | |
| 6,567,518 B1 | 5/2003 | Weir | |
| 6,614,259 B2 * | 9/2003 | Couts-Martin et al. | 326/40 |
| 6,785,165 B2 | 8/2004 | Kawahara et al. | |
| 7,078,929 B1 | 7/2006 | Draper | |
| 2004/0061147 A1 | 4/2004 | Fujita et al. | |
| 2004/0064622 A1 | 4/2004 | Smith | |

OTHER PUBLICATIONS

Atmel Datasheet entitled "FPGA Configuration EEPROM Memory 3.3V and 5V System Support", Rev. 2321E-CNFG-06/03, pp. 1-23.
MAX II Device Handbook, vol. 1, Chapter 3, JTAG & In-System Programmability, Altera Corporation, Dec. 2004, pp. 3-1 through 3-8.
U.S. Appl. No. 10/809,658, filed Mar. 25, 2004.
Notice of Allowance in U.S. Appl. No. 11/098,713, for double patenting review, filed Apr. 4, 2005.

* cited by examiner

*Primary Examiner*—Daniel D Chang
(74) *Attorney, Agent, or Firm*—Mendelsohn & Associates, P.C.; Kevin M. Drucker; Steve Mendelsohn

(57) ABSTRACT

In one embodiment of the invention, a programmable logic device such as an FPGA includes a programmable fabric; a JTAG interface operable to receive configuration data for programming the fabric; a SPI interface operable to receive and transmit configuration data for programming the fabric; and circuitry coupled to the JTAG and SPI interfaces. The circuitry is operable, without being configured, to transfer configuration data received at the JTAG interface to the SPI interface for transmission to an external device having a SPI interface, such as a serial flash memory.

20 Claims, 6 Drawing Sheets

IN-SYSTEM PROGRAMMING OF A NON-COMPLIANT DEVICE USING MULTIPLE INTERFACES OF A PLD

TECHNICAL FIELD

The present invention relates to programmable logic devices, such as field-programmable gate arrays (FPGAs), and, in particular, to techniques for programming certain devices, such as serial flash memory, that hold data for configuring an FPGA.

BACKGROUND

Volatile programmable logic devices, such as FPGAs, typically rely on non-volatile external storage media to hold data used to configure the devices. For example, programmable read-only memory (PROM) devices are often used to hold the configuration data for FPGAs. Such devices are referred to as "boot PROMs," because they are used to boot (i.e., initialize) programmable devices, such as volatile FPGAs. A boot PROM device is first programmed with a data pattern in the form of a bitstream corresponding to the desired FPGA configuration, which is typically achieved using an off-board stand-alone programming device, although it is often preferable to program the PROM on-board or in-system.

On-board PROM programming is typically performed using a JTAG interface, which is adapted to communicate with devices compliant with the Joint Test Action Group (JTAG) IEEE 1149.1 standard, which governs in-system flash programming. Hence, the term "JTAG" is used with reference both to the standard itself and to devices that are compliant with the standard, which are referred to simply as "JTAG devices."

However, most memory devices that are commonly used as boot PROMs do not comply with the JTAG standard and thus typically require off-board programming. These devices include, e.g., flash memory devices having a Serial Peripheral Interface (SPI) interface. As understood by those skilled in the art, the term "SPI" indicates compliance with the Serial Peripheral Interface industry bus standard specified by Motorola Corporation of Schaumburg, Ill.

FIG. 1 illustrates a first conventional architecture 110 for programming a JTAG-noncompliant boot PROM 120. FPGA 112 includes an on-chip JTAG interface 116 (often referred to as a "JTAG engine" or as a "Test Access Port (TAP) controller") and an on-chip SPI interface 118. SPI interface 118 of FPGA 112 is connected to a SPI interface 114 of a boot PROM 120. In the configuration shown, two headers 122, 124 are provided. The first header is a JTAG header 122 connected to JTAG interface 116 and is used for programming FPGA 112 from an external device (not shown) attached to JTAG header 122. The second header is a SPI header 124 connected to SPI interfaces 118 and 114 and is used to program boot PROM 120 by means of an external device (not shown) coupled to SPI header 124. This configuration permits three modes of operation: (1) programming boot PROM 120 using an external device attached to SPI header 124; (2) using programmed boot PROM 120 to program FPGA 112; and (3) programming FPGA 112 through its JTAG interface. This approach involves the board space and fabrication cost of providing two different headers involving two different sets of operations.

FIG. 2 illustrates a second conventional architecture 210 for programming a JTAG-noncompliant boot PROM 220. FPGA 212 includes an on-chip JTAG interface 216 and an on-chip SPI interface 218. SPI interface 218 of FPGA 212 is connected to a SPI interface 214 of a boot PROM 220. In the configuration shown, a JTAG header 222 is connected to JTAG interface 216 and is used for programming FPGA 212 from an external device (not shown) attached to JTAG header 222. JTAG interface 216 and SPI interface 218 are not electrically connected to one another until FPGA 212 has been programmed to make such internal connections, as illustrated graphically by the broken lines in region 226. This configuration permits three modes of operation: (1)(a) first using an external device (not shown) coupled to JTAG header 222 to pre-program FPGA 212 via JTAG interface 216, thereby forming the internal connections shown in region 226, and then (b) using the external device attached to JTAG header 222 to program boot PROM 220 via internal connections to SPI interface 218; (2) using boot PROM 220 to program FPGA 212; and (3) programming FPGA 212 through its JTAG interface 216. The two-step approach for programming boot PROM 220 complicates the programming process, thereby increasing programming cost. This cost of pre-programming an FPGA device becomes prohibitive when a large volume of on-board production programming of the boot PROM is done on automated testing equipment (ATE). Moreover, this two-step programming approach complicates the process of performing field upgrades to the boot PROM.

SUMMARY

In one embodiment of the invention, a programmable logic device includes a programmable fabric; a first interface compliant with a first standard and operable to receive configuration data for programming the fabric; a second interface compliant with a second standard and operable to receive and transmit configuration data for programming the fabric; and dedicated circuitry coupled to the first and second interfaces. The dedicated circuitry is operable to transfer configuration data received at the first interface in accordance with the first standard to the second interface for transmission in accordance with the second standard to an external device having an interface compliant with the second standard.

In another embodiment of the invention, a programmable logic device includes a programmable fabric; a JTAG interface operable to receive configuration data for programming the fabric; a SPI interface operable to receive and transmit configuration data for programming the fabric; and circuitry coupled to the JTAG and SPI interfaces. The circuitry is operable, without being configured, to transfer configuration data received at the JTAG interface to the SPI interface for transmission to an external device having a SPI interface.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Single SPI Boot PROM Architecture

Figure 3:
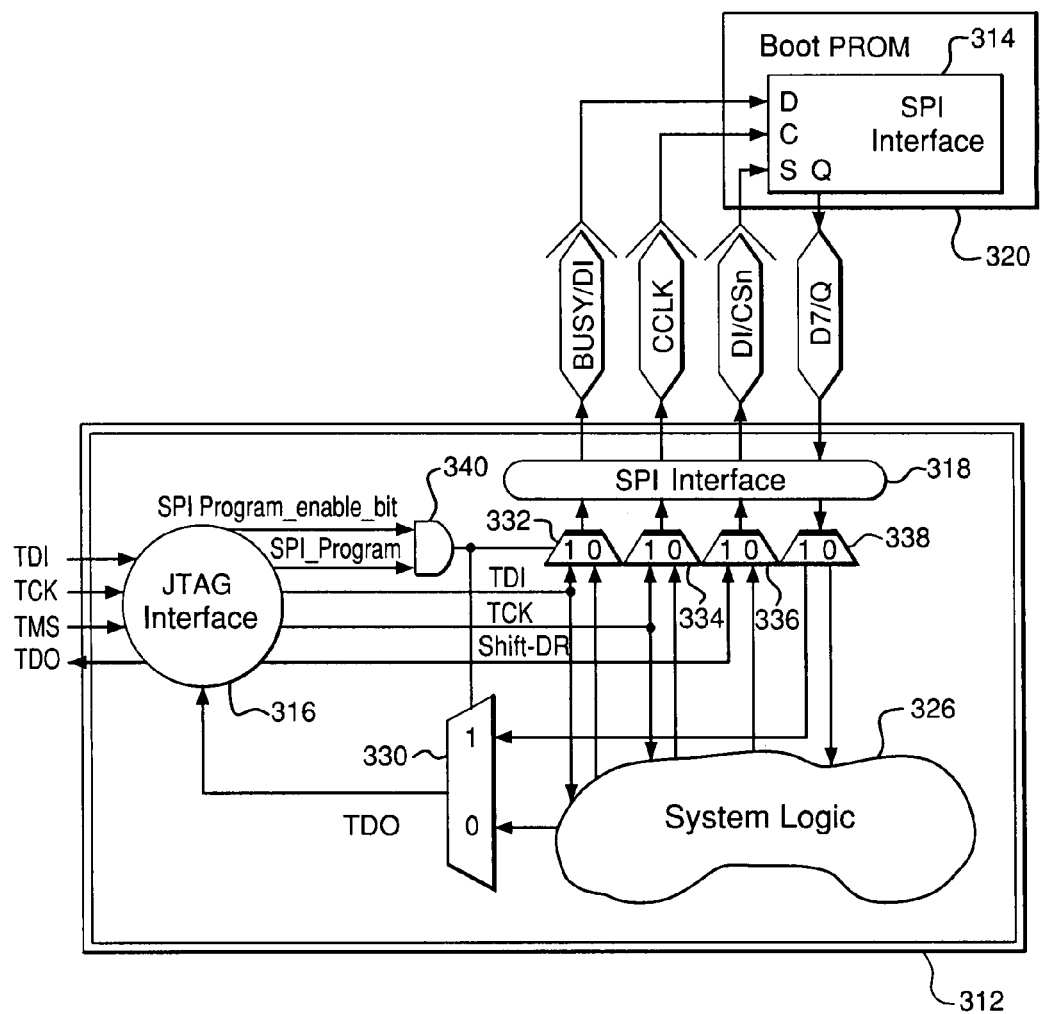
FIG. 3 is a block diagram of a first embodiment of the present invention for programming a JTAG-noncompliant boot PROM.

FIG. 3 shows a block diagram of an exemplary architecture 310 in a first embodiment of the present invention, for using an FPGA 312 to program a JTAG-noncompliant boot PROM 320 in an electronic system. As shown, in this exemplary embodiment, PROM 320 is a conventional SPI serial flash PROM device that includes a port for a SPI interface 314. FPGA 312 includes ports for a JTAG interface 316 and a SPI interface 318, programmable fabric or system logic 326, a gate 340, four multiplexers (muxes) 330, 332, 334, 336, and a demultiplexer (demux) 338. JTAG interface 316 connects to a JTAG header (not shown) for attachment to an external JTAG-compliant device (not shown).

JTAG interface 316 receives signals TDI, TCK, and TMS from the external device and provides a signal TDO to the external device, which signals are defined as follows:

TDI: Test Data Input signal provided by the external device for supplying one or more of instructions and data (e.g., configuration data) from the external device to the registers of JTAG interface 316.

TMS: Test Mode Select signal provided by the external device for selecting the operational mode of JTAG interface 316, i.e., controlling JTAG interface state machine transitions.

TDO: Test Data Output signal provided to the external device for serially outputting one or more of instructions and data from the registers of JTAG interface 316 to the external device.

TCK: Dedicated Test Clock signal provided by the external device for controlling timing of the JTAG interface independently from other FPGA system clocks. This signal is used to shift the TMS and TDI signals into JTAG interface 316 and to shift the TDO signal out of the JTAG interface 316.

Within FPGA 312, JTAG interface 316 provides and receives the following signals:

SPI_Program_enable_bit: Signal provided to gate 340 for jointly controlling, with signal SPI_Program, whether boot PROM 320 is being programmed by FPGA 312.

SPI_program: Signal provided to gate 340 for jointly controlling, with signal SPI_Program_enable_bit, whether boot PROM 320 is being programmed by FPGA 312.

TDI: Test Data Input signal (e.g., configuration data) provided to multiplexer 332 and to system logic 326.

TCK: Test Clock signal provided to multiplexer 334 and to system logic 326.

/Shift-DR: Control signal provided to multiplexer 336, for enabling SPI interface 314 of PROM 320.

TDO: Test Data Output signal provided to JTAG Interface 316 by multiplexer 330.

SPI interface 318 of FPGA 312 interfaces with SPI interface 314 of PROM 320 and provides to and receives from SPI interface 314 the following signals:

BUSY/DI (D): Data Input signal for transmitting commands and data (e.g., configuration data) from SPI interface 318 to SPI interface 314.

CCLK (C): Configuration Clock signal transmitted from SPI interface 318 to SPI interface 314, used to control the timing of storing serial configuration data into PROM 320 and reading serial configuration data out from PROM 320.

DI/CSn (S): Control Signal for enabling SPI interface 314 of PROM 320.

D7/Q (Q): Data signal for transmitting commands and data (e.g., configuration data) from SPI interface 314 of PROM 320 to SPI interface 318 of FPGA 312.

Dedicated circuitry (i.e., circuitry that is operable to perform its intended function without being programmed or configured) is integrated within FPGA 312 to couple JTAG interface 316 to SPI interface 318. Such circuitry may be implemented in a number of ways. In one embodiment, the circuitry includes the following logic devices. Gate 340 is an AND gate in the exemplary embodiment shown, although one or more other switching devices (e.g., a latch) could alternatively be used to achieve the same or similar functionality. Gate 340 receives signals SPI_Program_enable_bit and SPI_Program from JTAG interface 316, applies a logical AND operation to the two signals, and provides a resulting one-bit control signal to multiplexers 330, 332, 334, and 336 and to demultiplexer 338. If this one-bit control signal is high, then the "1" inputs of multiplexers 330, 332, 334, and 336 and the "1" output of demultiplexer 338 are selected, and if this control signal is low, then the "0" inputs of multiplexers 330, 332, 334, and 336 and the "0" output of demultiplexer 338 are selected. The reason for using two separate signals SPI_Program_enable_bit and SPI_program in this embodiment is for security, to minimize the chance of accidental programming of boot PROM 320 that might occur if only a single signal were used. In other embodiments of the invention, a single signal could be used instead of two signals, and AND gate 340 could be eliminated.

System logic 326 receives configuration data provided by boot PROM 320. System logic 326 may also be used during normal operation of FPGA 312, to provide and receive commands and/or data, e.g., via the JTAG interface 316.

Multiplexer 330 provides a TDO signal to JTAG interface 316. If the "1" input of multiplexer 330 is selected, then multiplexer 330 selects a signal received from demultiplexer 338 to be output as TDO. If the "0" input of multiplexer 330 is selected, then multiplexer 330 selects a signal generated by system logic 326 to be provided as TDO. During normal operation, signals other than those shown in FIG. 3 may be transferred between JTAG interface 316 and system logic 326.

Multiplexer 332 provides a data signal to SPI interface 318, which signal SPI interface 318 provides to SPI interface 314 of boot PROM 320 as BUSY/DI (D). If the "1" input of multiplexer 332 is selected, then multiplexer 332 selects the TDI signal received from JTAG interface 316 to be provided to SPI interface 318. If the "0" input of multiplexer 332 is selected, then multiplexer 332 selects a data signal received from system logic 326 to be provided to SPI interface 318.

Multiplexer 334 provides a clock signal to SPI interface 318, which signal SPI interface 318 provides to SPI interface 314 of boot PROM 320 as CCLK (C). If the "1" input of multiplexer 334 is selected, then multiplexer 334 selects the TCK signal received from JTAG interface 316 to be provided to SPI interface 318. If the "0" input of multiplexer 334 is selected, then multiplexer 334 selects a clock signal received from system logic 326 to be provided to SPI interface 318.

Multiplexer 336 provides a control signal to SPI interface 318, which signal SPI interface 318 provides to SPI interface 314 of boot PROM 320 as DI/CSn (S). If the "1" input of multiplexer 336 is selected, then multiplexer 336 selects the /Shift-DR signal received from JTAG interface 316 to be provided to SPI interface 318. If the "0" input of multiplexer 336 is selected, then multiplexer 336 selects a control signal received from system logic to be provided to SPI interface 318.

Demultiplexer 338 receives a data signal D7/Q (Q) from SPI interface 314 of boot PROM 320. If the "1" output of demultiplexer 338 is selected, then demultiplexer 338 provides the data signal received from SPI interface 314 to the "1" input of multiplexer 330. If the "0" output of demultiplexer 338 is selected, then demultiplexer 338 provides the data signal received from SPI interface 314 to system logic 326.

SPI interface 318 receives the output signals from multiplexers 332, 334, and 336 and provides these signals to boot PROM 320 as BUSY/DI (D), CCLK (C), and DI/CSn (S). SPI interface 318 receives input signal D7/Q (Q) from boot PROM 320 and provides this signal to demultiplexer 338.

Devices 330, 332, 334, 336, and 338 could alternatively be replaced with one or more other switching devices to achieve the same or similar functionality. While devices 330, 332, 334, 336, and 338 are shown in FIG. 3 as being independent from other components, it should be recognized that one or more of these devices could alternatively be incorporated into SPI interface 318 or another portion of FPGA 312.

JTAG interface 316 of FPGA 312, in this exemplary embodiment, includes instruction registers, and data registers. The data registers include a CONFIG (also called boundary-scan) register and a BYPASS register. The data shifted into the instruction registers define what actions are to be carried out by the JTAG circuitry. The CONFIG register allows access to the I/O pins of the chip, e.g., for testing or configuration purposes. The BYPASS register is selected after a reset or during a bypass instruction, in which case data is passed serially directly from the TDI to the TDO pins of the JTAG interface.

JTAG interface 316 of FPGA 312, in this exemplary embodiment, implements a sixteen-state finite-state machine (although other numbers of states are possible in other embodiments) for controlling the state progression of the JTAG logic and providing serial access to the instruction and data modules of JTAG interface 316. The state machine responds to control sequences supplied through the TMS input to JTAG interface 316.

Figure 5:
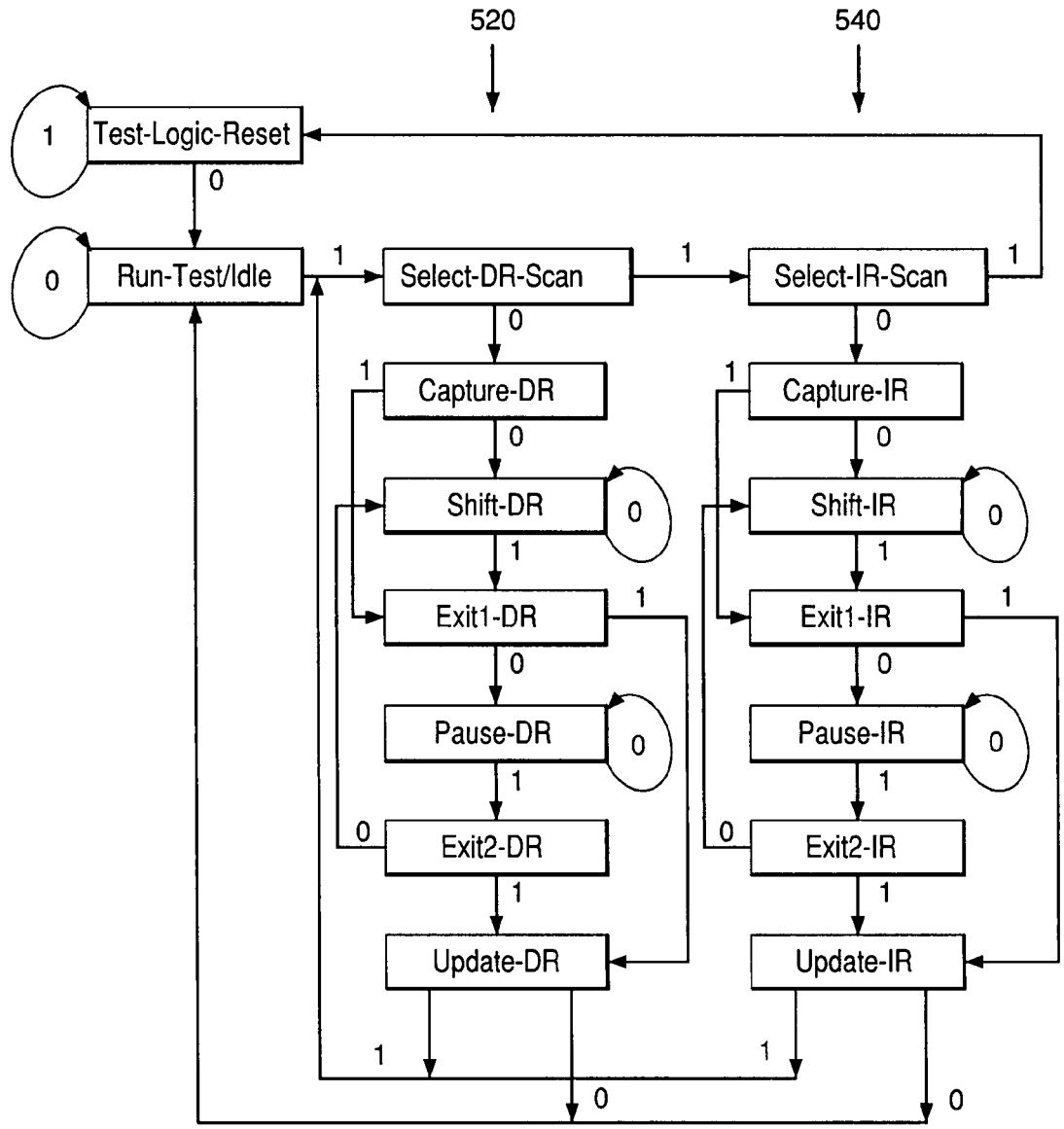
FIG. 5 is a state transition diagram for the JTAG interface of the FPGA of FIG. 3.

The state machine performs according to the state transition diagram provided as FIG. 5, wherein the "0" and "1" values indicate the TMS values that control state transitions. In data path 520, states include the letters "-DR," and the data registers operate. In instruction path 540, states include the letters "-IR," and the instruction registers operate.

JTAG interface 316 uses the two inputs TMS and TCK to generate control and clock signals for the rest of JTAG interface 316. The state of the state machine changes based on the value of TMS.

The operation of each state is described below:
Test-Logic-Reset: All on-chip logic is disabled in this state, thereby enabling the normal operation of JTAG interface 316. Upon power-up, the state machine enters the Test-Logic-Reset state.
Run-Test-Idle: In this state, the logic in JTAG interface 316 is active only if certain instructions are present. For example, if an instruction activates the self-test, then the self-test is executed when JTAG interface 316 is in this state. The logic in JTAG interface 316 is otherwise idle.
Select-DR-Scan: This state controls whether to enter proceed with data path 520 or transition to the Select-IR-Scan state.
Select-IR-Scan: This state controls whether to proceed with instruction path 540 or return to the Test-Logic-Reset state.
Capture-IR: In this state, a shift register bank in the instruction registers loads in parallel a pattern of fixed values, and an instruction is loaded into one of the instruction registers.
Shift-IR: In this state, the instruction registers become connected between TDI and TDO, and the captured instruction gets shifted out to TDO. The next instruction present at the TDI input is also shifted in to the instruction registers.
Exit1-IR: This state controls whether to enter the Pause-IR state or Update-IR state.
Pause-IR: In this state, the shifting of the instruction registers is halted.
Exit2-IR: This state controls whether to enter either the Shift-IR state or Update-IR state.
Update-IR: In this state, the instruction in the instruction registers is latched to a latch bank, at which point the instruction becomes the current instruction for execution.
Capture-DR: In this state, data is loaded into one of the data registers selected by the current instruction.
Shift-DR: In this state, the data registers become connected between TDI and TDO, and the captured data gets shifted out to TDO. The next data available on the TDI pin is shifted in to the data registers.
Exit1-DR: This state controls whether to enter the Pause-DR state or Update-DR state.
Pause-DR: In this state, the shifting of the data registers is halted.
Exit2-DR: This state controls whether to enter either the Shift-DR state or Update-DR state.
Update-DR: In this state, the data in the data registers is latched to a latch bank, at which point the data becomes the current data.

JTAG interface 316 supports three modes of operation: (1) programming boot PROM 320 using FPGA 312; (2) using programmed boot PROM 320 to program FPGA 312; and (3) normal operation of FPGA 312.

(1) Programming boot PROM 320 using FPGA 312: This mode is entered when JTAG interface 316 generates a "1" for both of the signals SPI_Program_enable_bit and SPI_program, which causes gate 340 to output a "1" signal. Receipt of the "1" signal causes the following connections to be made within FPGA 312:
  (i) multiplexer 332 provides the TDI signal from JTAG interface 316 to SPI interface 318, which signal SPI interface 318 provides as BUSY/DI (D) to SPI interface 314 of boot PROM 320;
  (ii) multiplexer 334 provides the TCK signal from JTAG interface 316 to SPI interface 318, which signal SPI interface 318 provides as CCLK (C) to SPI interface 314 of boot PROM 320;
  (iii) multiplexer 336 provides the /Shift-DR signal from JTAG interface 316 to SPI interface 318, which signal SPI interface 318 provides as DI/CSn (S) to SPI interface 314 of boot PROM 320;
  (iv) demultiplexer 338 provides to multiplexer 330 the signal received by SPI interface 318 as D7/Q (Q) from SPI interface 314 of boot PROM 320; and (v) multiplexer 330 provides the signal received from demultiplexer 338 as signal TDO to JTAG interface 316.

In this mode of operation, the foregoing connections permit FPGA 312 to program boot PROM 320 with the stored boot pattern, via JTAG interface 316 and SPI interface 318 of FPGA 312 and SPI interface 314 of boot PROM 320.

Figure 4:
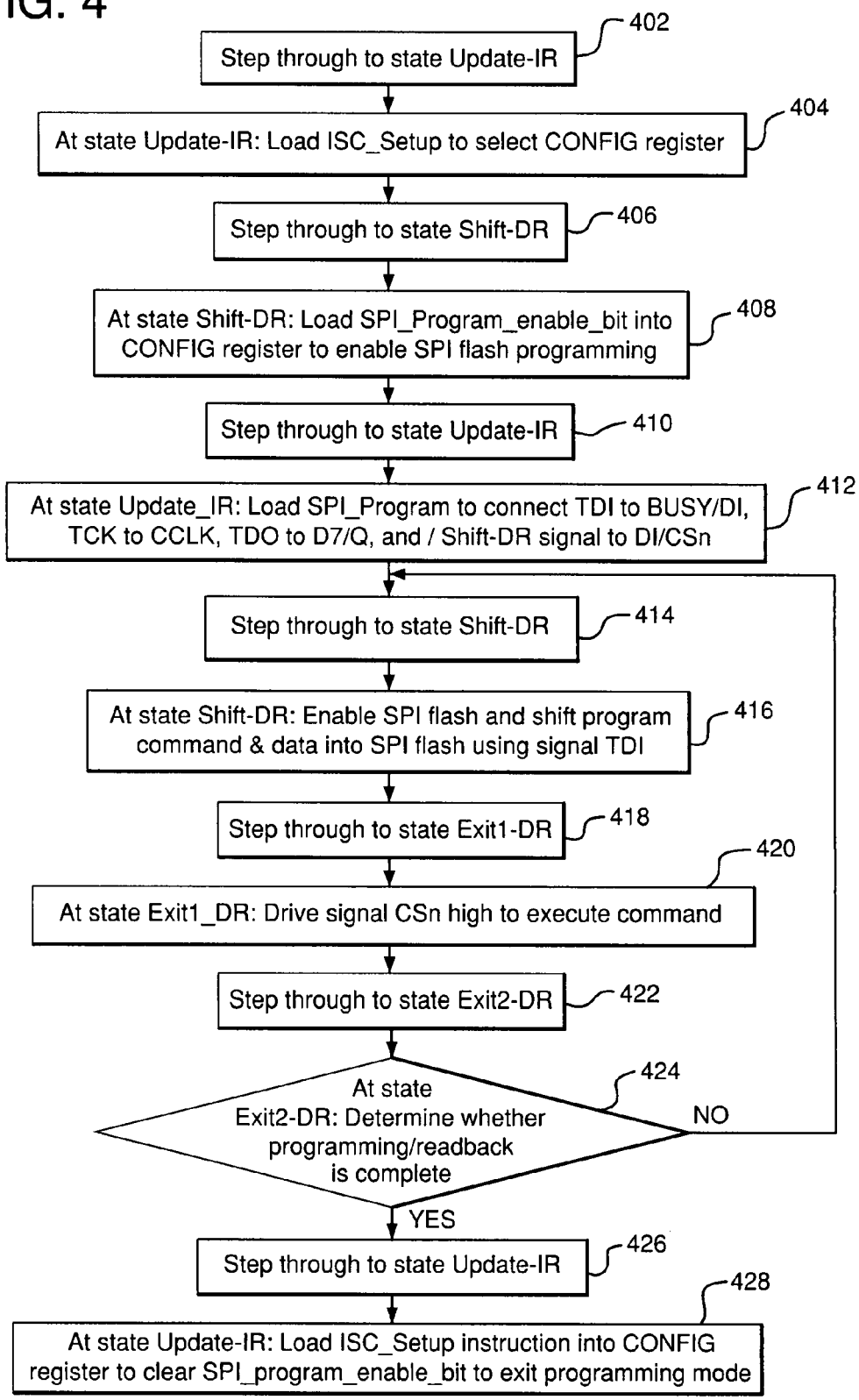
FIG. 4 is a flow diagram for programming the PROM in of FIG. 3.

An exemplary method of programming of PROM 320 proceeds as follows, with reference now to the exemplary flowchart of FIG. 4. At block 402, the state machine steps through to the Update-IR state. At block 404, a setup instruction ISC_Setup is loaded to select the CONFIG register of JTAG interface 316. At block 406, the state machine steps through to the Shift-DR state. At block 408, the SPI_Program_enable_bit is loaded into the CONFIG register to enable programming of boot PROM 320. At block 410, the state machine steps through to the Update-IR state. At block 412, the SPI_Program bit is loaded to connect (i) the TDI output of JTAG interface 316 with the BUSY/DI (D) input of SPI interface 318; (ii) the TCK output of JTAG interface 316 with the CCLK (C) input of SPI interface 318; (iii) the /Shift-DR output of JTAG interface 316 with the DI/CSn (S) input of SPI interface 318; and (iv) the TDO input of JTAG interface 316 with the D7/Q (Q) output of SPI interface 318. At block 414, the state machine steps through to the Shift-DR state. At block 416, programming of boot PROM 320 is enabled, and a program command and configuration data can be shifted into the PROM using signal TDI. At block 418, the state machine steps through to state Exit1-DR. At block 420, the signal CSn is driven high to execute the command. At block 422, the state machine steps through to state Exit2-DR. At block 424, a determination is made whether programming is complete, in which case the method proceeds to block 426. If programming is not complete, then the method returns to block 414 to load more configuration data into PROM 320. At block 426, the state machine steps through to state Update-IR. At block 428, the setup instruction ISC_Setup is loaded to clear the SPI_Program_enable_bit to exit programming mode.

(2) Using programmed boot PROM 320 to program FPGA 312: This mode is entered when JTAG interface 316 has not generated a "1" for both of the signals SPI_Program_enable_bit and SPI_program, in which case gate 340 outputs a "0" signal. Receipt of the "0" signal causes the following connections to be made within FPGA 312:

- (i) multiplexer 332 provides a data signal from system logic 326 to SPI interface 318, which SPI interface 318 provides as BUSY/DI (D) to SPI interface 314 of boot PROM 320;
- (ii) multiplexer 334 provides a clock signal from system logic 326 to SPI interface 318, which SPI interface 318 provides as CCLK (C) to SPI interface 314 of boot PROM 320;
- (iii) multiplexer 336 provides a control signal from system logic 326 to SPI interface 318, which SPI interface 318 provides as DI/CSn (S) to SPI interface 314 of boot PROM 320;
- (iv) demultiplexer 338 provides to system logic 326 the signal received by SPI interface 318 as D7/Q (Q) from SPI interface 314 of boot PROM 320; and
- (v) multiplexer 330 provides the signal received from system logic CGas signal TDO to JTAG interface 316.

In this mode of operation, the foregoing connections permit boot PROM 320 to program FPGA 312 with the stored FPGA boot pattern via the respective SPI interfaces 314, 318 of the devices, as is conventionally done in the prior art.

(3) Normal operation of FPGA 312: The internal connections for this conventional prior art mode of operation are the same as those of mode (2). In this mode of operation, FPGA 312 interfaces with an external device (not shown) connected to JTAG interface 316 for normal FPGA operation. The TDI and TCK signals from the JTAG interface are provided to system logic 326, and the TDO signal received from system logic 326 is provided to JTAG interface 316.

Multiple SPI Boot PROM Architecture

Figure 1:
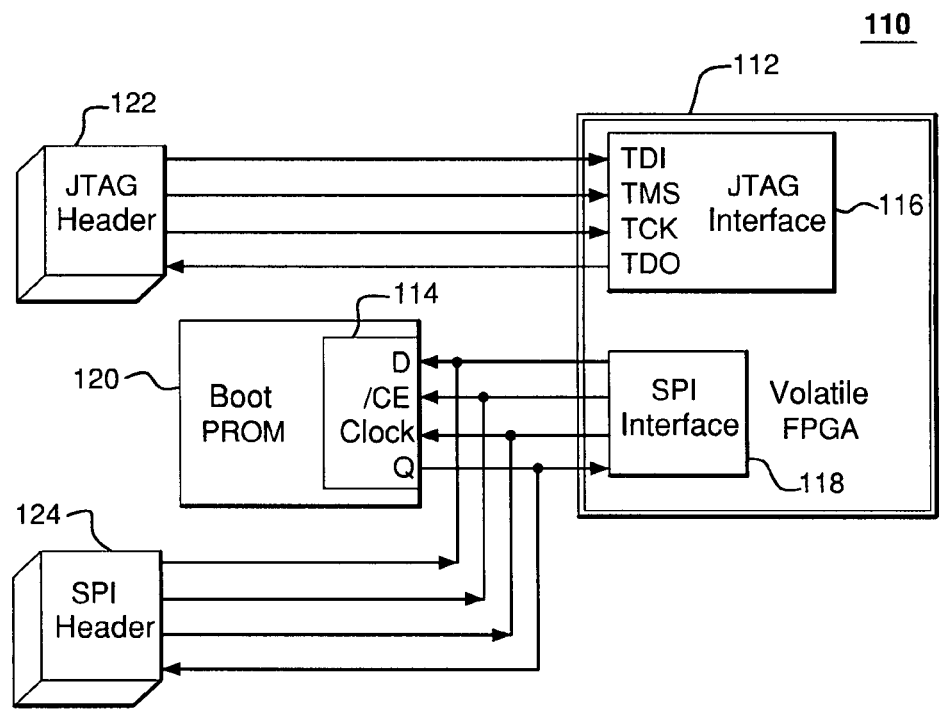
FIG. 1 is a block diagram of a first conventional architecture for programming a JTAG-noncompliant boot PROM.
Figure 2:
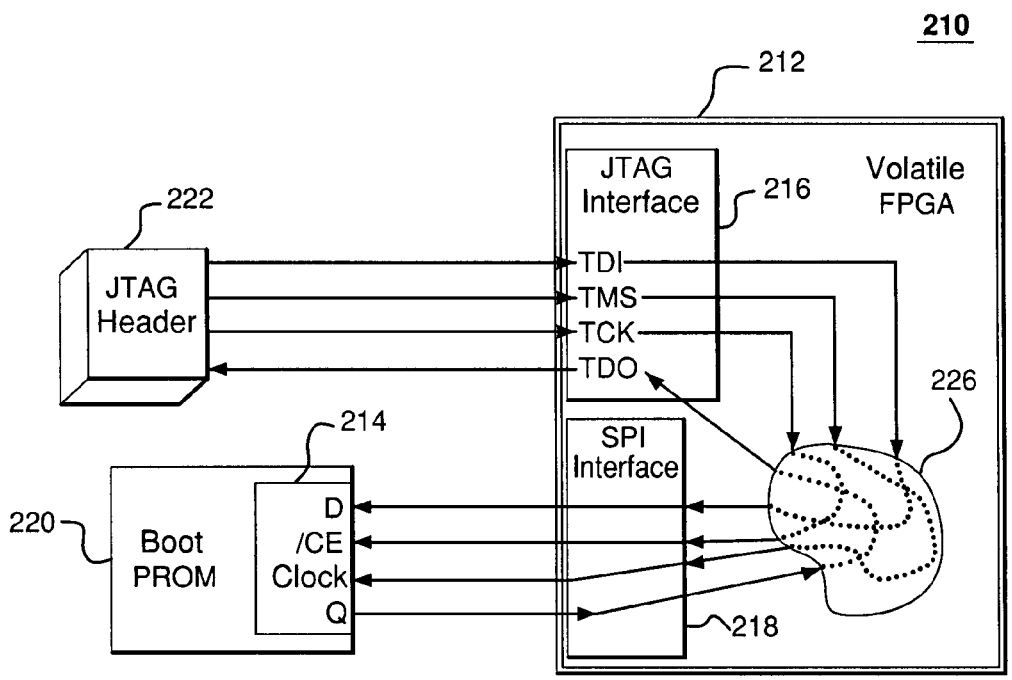
FIG. 2 is a block diagram of a second conventional architecture for programming a JTAG-noncompliant boot PROM.
Figure 6:
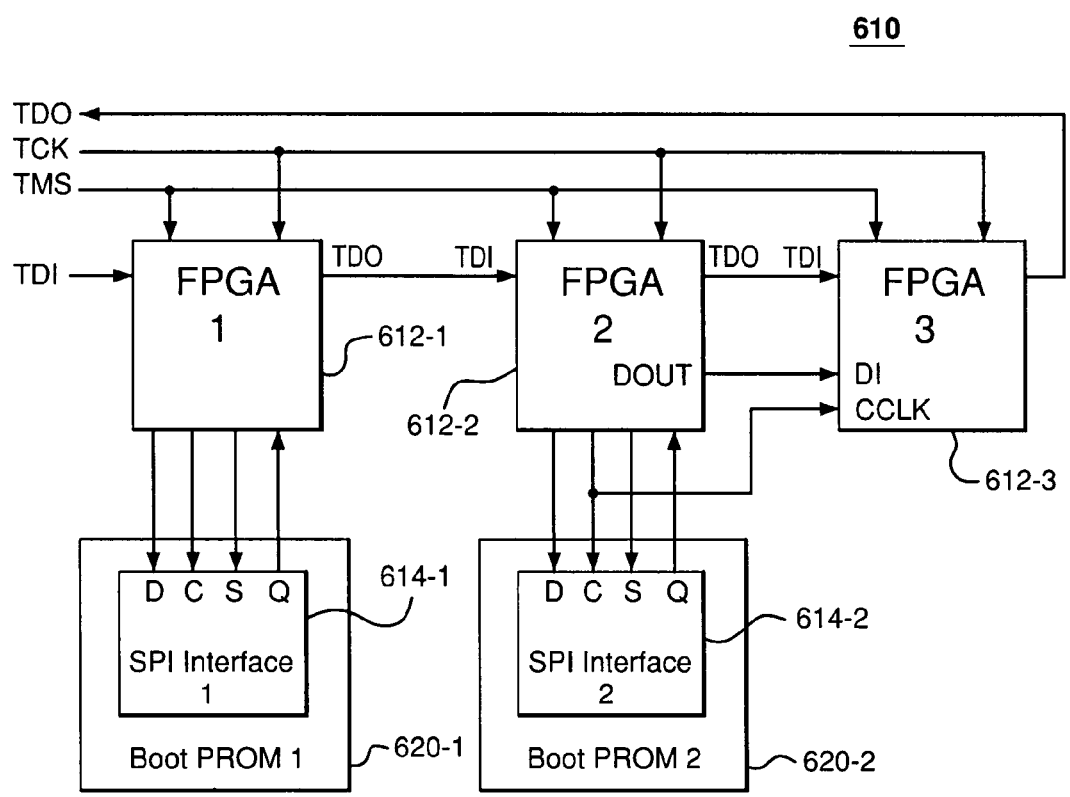
FIG. 6 is a block diagram of a second embodiment of the present invention for programming multiple JTAG-noncompliant boot PROMs.

FIG. 6 shows a block diagram of an exemplary architecture 610 in a second embodiment of the present invention, for permitting multiple JTAG-noncompliant boot PROMs to be programmed in a daisy-chain formation using a plurality of FPGAs. As shown, this exemplary embodiment includes a JTAG chain of three FPGAs 612-1, 612-2, 612-3 connected to two boot PROMs 620-1, 620-2 at their respective SPI interfaces 614-1, 614-2. For ease of reference, the details of the JTAG and SPI ports of FPGAs 612-1, 612-2 are not shown, since such details are provided in FIG. 3 and its corresponding description above. FPGA 612-3 may be an FPGA consistent with the invention, as shown in FIG. 3, or may, alternatively, be a legacy or conventional FPGA, e.g., as shown in FIG. 1 or 2.

In this exemplary embodiment, FPGA 612-1 is used to program PROM 620-1, and FPGA 612-2 is used to program PROM 620-2. PROM 620-1 serves as the boot PROM for FPGA 612-1. PROM 620-2 is the boot PROM for both FPGAs 612-2 and 612-3, where FPGA 612-3 is a slave device.

The configuration of the JTAG connections and signals of this embodiment will now be described. The TCK and TMS inputs of FPGAs 612-1, 612-2, and 612-3 are connected in parallel, such that all three FPGAs 612-1, 612-2, and 612-3 share the TCK and TMS signals, which are provided by an external device (not shown). The TDI input from the external device is provided only to FPGA 612-1, which provides its TDO signal as the TDI input to FPGA 612-2. Likewise, FPGA 612-2 provides its TDO signal as the TDI input to FPGA 612-3. The TDO signal provided by FPGA 612-3 is provided to the external device.

Although not specifically shown in FIG. 6, the signals provided by the JTAG interface of FPGA 612-1 to the SPI interface of FPGA 612-1 and the signals provided by the JTAG interface of FPGA 612-2 to the SPI interface of FPGA 612-2 are the same as those appearing within FPGA 312, as illustrated in FIG. 3 and described in its corresponding description above.

Boot PROMs 620-1 and 620-2 are conventional SPI flash devices, each including a respective SPI interface 614-1, 614-2. SPI interfaces 614-1, 614-2 are connected directly to the SPI interfaces implemented within FPGAs 612-1 and 612-2, respectively. The CCLK output of the SPI interface of FPGA 612-2 is also provided to the CCLK input of the SPI interface of FPGA 612-3 to provide configuration clocking signals.

In this configuration, FPGA 612-2 uses an additional DOUT pin that is not used on FPGAs 612-1 and 612-3. The DOUT pin provides a "flow-through," "bypass," or "overflow" signal, such that, when the memory of FPGA 612-2 becomes full while reading in data from boot PROM 620-2, the excess data is provided to the DI port of the SPI interface of FPGA 612-3. The DOUT output of FPGA 612-2 is provided directly to the DI input of the SPI interface of FPGA 612-3 and is used to populate FPGA 612-3 with the boot pattern for FPGA 612-3 stored in boot PROM 620-2. The foregoing functionality may employ the Serial Configuration Mode (SCM) of the FPGA 612-2, whereby FPGA 612-2 emulates a boot PROM to the slave device, FPGA 612-3.

Figure 7:
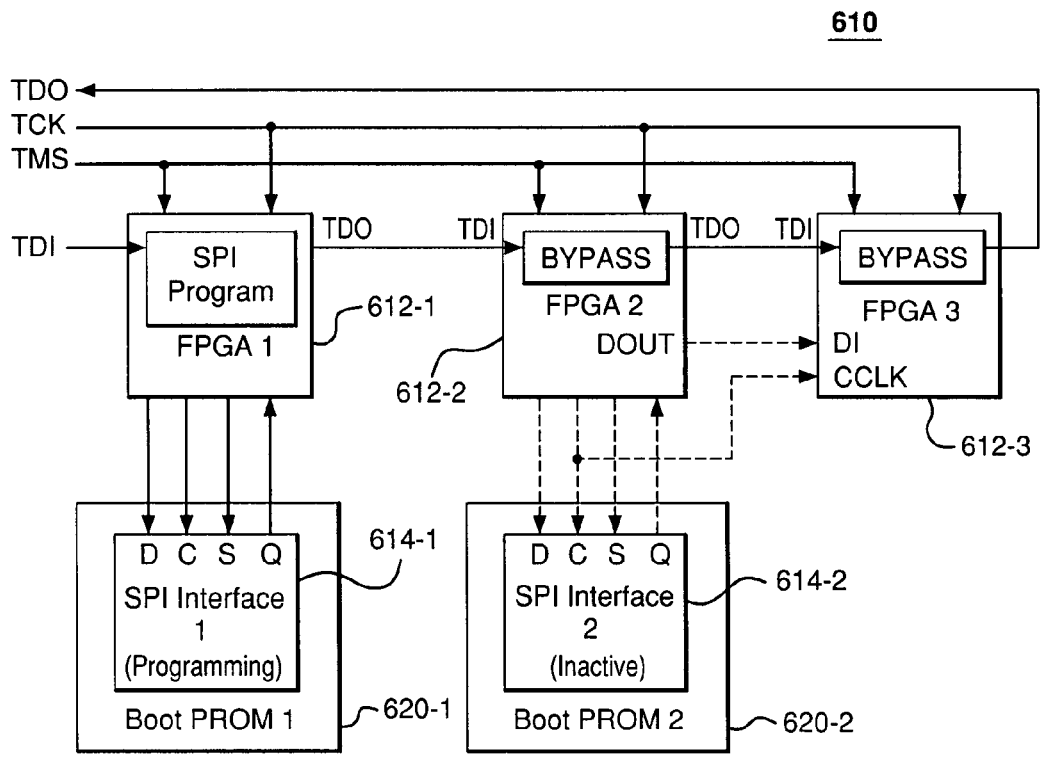
FIG. 7 is a block diagram of the architecture of FIG. 6 during the programming of the first PROM, with the second and third FPGAs inactive.
Figure 8:
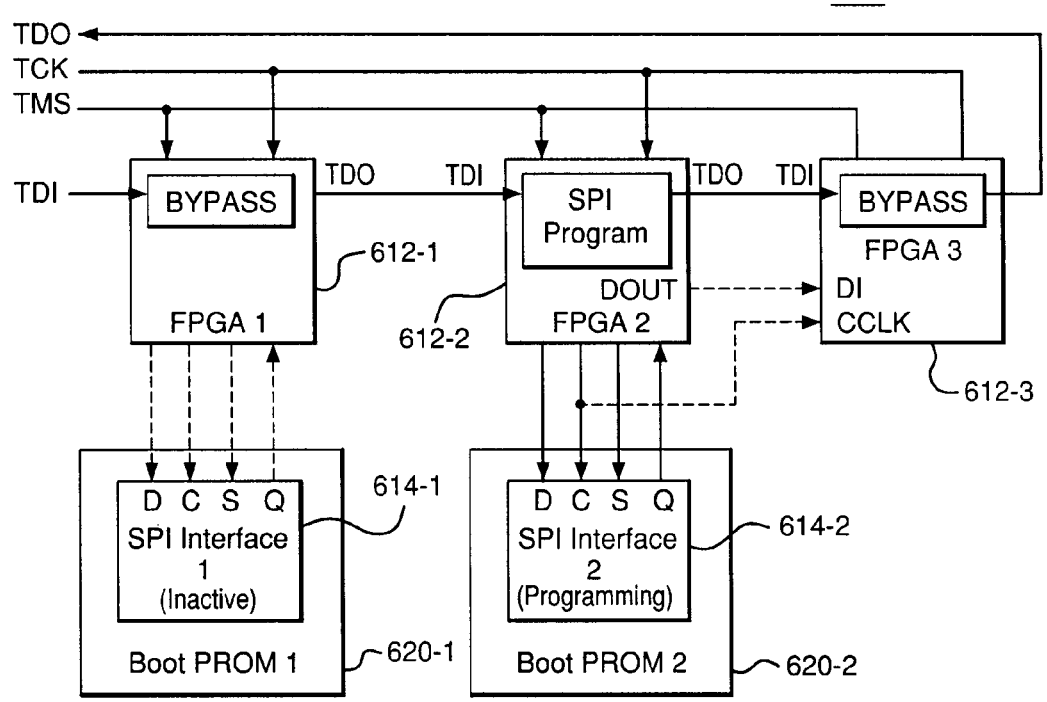
FIG. 8 is a block diagram of the architecture of FIG. 6 during the programming of the second PROM, with the first and third FPGAs inactive.

With reference to FIGS. 7 and 8, an exemplary method of programming the SPI flash of boot PROMs 620-1 and 620-2 of FIG. 6, consistent with one embodiment of the present invention, will now be described. FIG. 7 shows a block diagram of the architecture of FIG. 6 during the programming of the first PROM 620-1, with the second and third FPGAs 612-2, 612-3 inactive, and FIG. 8 shows a block diagram of the architecture of FIG. 6 during the programming of the second PROM 620-2, with the first and third FPGAs 612-1, 612-3 inactive.

Turning first to FIG. 7, the architecture of FIG. 6 is shown during the programming of PROM 620-1, with FPGAs 612-2 and 612-3 inactive. First, at state Update-IR, a BYPASS instruction is loaded into FPGAs 612-2 and 612-3, and an in-system setup instruction ISC_Setup is loaded into FPGA 612-1, thereby selecting single-bit BYPASS registers of FPGAs 612-2 and 612-3 and the CONFIG register of FPGA 612-1. Accordingly, FPGAs 612-2 and 612-3 will operate in normal operation mode (3) as described above, while FPGA 612-1 is in mode (1), i.e., programming PROM 620-1. Next, SPI_Program_enable_bit is loaded into the CONFIG register of FPGA 612-1 at state Shift-DR to enable programming of boot PROM 620-1. A SPI program instruction SPI_Program is then loaded into FPGA 612-1 at state Update-IR to cause the following connections to be made between the JTAG and SPI interfaces of FPGA 612-1:

(a) TDI to BUSY/DI for sending commands and data into the SPI flash of PROM 620-1;
(b) TCK to CCLK for clocking commands and/or data into and/or out of the SPI flash of PROM 620-1;
(c) /Shift-DR internal control signal to DI/CSn pin to enable the programming of PROM 620-1; and
(d) TDO to D7/Q for receiving data from the SPI flash of PROM 620-1.

Next, by transition to state Shift-DR, the programming of PROM 620-1 is enabled. A program command and corresponding data are then shifted into the SPI flash of PROM 620-1 using signal TDI. Then, by transition to state Exit1-DR, the signal CSn is driven high to execute the command. The foregoing steps of shifting program commands and data into the SPI flash of PROM 620-1 and executing the commands by driving the signal CSn high are repeated until programming and readback is complete. A BYPASS instruction is then loaded into FPGAs 612-2 and 612-3, and an in-system setup instruction ISC_Setup is loaded into the CONFIG register of FPGA 612-1 to clear the SPI_program_enable_bit, so that programming of PROM 620-1 is disabled, and FPGA 612-1 can operate in normal mode (3). After BYPASS instructions have been loaded into FPGAs 612-2 and 612-3, respectively, the single-bit BYPASS register is connected between the TDI and TDO connections of the respective FPGA devices. Effectively, the TDO connection of FPGA 612-1 uses two clock cycles to travel through the single-bit BYPASS register of FPGA 612-2 and then FPGA 612-3 to reach the TDO connection of the external header, where the signal can be read by the external device (for each device in the daisy chain, an additional clock cycle is used to flush through the single-bit BYPASS registers of each device in the chain to reach the last device in the chain).

Turning now to FIG. 8, the architecture of FIG. 6 is shown during the programming of PROM 620-2, with FPGAs 612-1 and 612-3 inactive. First, at state Update-IR, a BYPASS instruction is loaded into FPGAs 612-1 and 612-3, and an in-system setup instruction ISC_Setup is loaded into FPGA 612-2, thereby selecting the single-bit BYPASS registers of FPGAs 612-1 and 612-3 and the CONFIG register of FPGA 612-2. Accordingly, FPGAs 612-1 and 612-3 will operate in normal mode (3) while FPGA 612-2 is in mode (1), i.e., programming PROM 620-2. Next, SPI_Program_enable_bit is loaded into the CONFIG register of FPGA 612-2 at state Shift-DR to enable programming of PROM 620-2. A SPI program instruction SPI_Program is then loaded into FPGA 612-2 at state Update-IR to cause the following connections to be made between the JTAG and SPI interfaces of FPGA 612-2:

(a) TDI to BUSY/DI for sending commands and/or data into and/or out of the SPI flash of PROM 620-2;
(b) TCK to CCLK for clocking commands and data into or out of the SPI flash of PROM 620-2;
(c) /Shift-DR internal control signal to DI/CSn pin to enable the programming of PROM 620-2; and
(d) TDO to D7/Q for receiving data from the SPI flash of PROM 620-2.

Next, by transition to state Shift-DR, the programming of PROM 620-2 is enabled. A program command and corresponding data are then shifted into the SPI flash of PROM 620-2 using signal TDI. Then, by transition to state Exit1-DR, the signal CSn is driven high to execute the command. The foregoing steps of shifting program commands and data into the SPI flash of PROM 620-2 and executing the commands by driving the signal CSn high are repeated until programming and readback is complete. A BYPASS instruction is then loaded into FPGAs 612-1 and 612-3, and an in-system setup instruction ISC_Setup is loaded into the CONFIG register of FPGA 612-2 to clear the SPI_program_enable_bit, so that programming of FPGA 612-2 is disabled, and FPGA 612-2 returns to normal mode (3). After BYPASS instructions have been loaded into FPGAs 612-1 and 612-3, respectively, the single-bit BYPASS register is connected between the TDI and TDO connections of the respective FPGA devices. Effectively, the TDI connection of FPGA 612-1 uses an additional clock cycle to travel through the single-bit BYPASS register of FPGA 612-1 to reach the TDI connection of FPGA 612-2. Similarly, the TDO connection of FPGA 612-2 uses one clock cycle to travel through the single-bit BYPASS register of FPGA 612-3.

Consequently, PROM 620-1 is ready to be used as a boot PROM for FPGA 612-1, and PROM 620-2 is ready to be used as a boot PROM for FPGAs 612-2 and 612-3. PROM 620-1 can send its stored boot pattern to FPGA 612-1 via the respective SPI interfaces of the devices, and PROM 620-2 can send its stored boot pattern to FPGA 612-2 via the respective SPI interfaces of the devices. When the memory of FPGA 612-2 is full, i.e., the boot pattern for FPGA 612-2 has been completely transferred to FPGA 612-2, the DOUT pin of FPGA 612-2 provides the overflow data from PROM 620-2 (i.e., the boot pattern for FPGA 612-3) to the DI pin of the SPI interface of FPGA 612-3.

It should be recognized that the foregoing configuration is not limited to three FPGAs and two boot PROMS, but that such a configuration can be analogously extended to architectures having other numbers of FPGAs and/or boot PROMs. For example, a single boot PROM can be used to configure more than two FPGAs in a daisy-chain manner. Moreover, the FPGA devices 612-1, 612-2, and 612-3 can be arranged in a different order than that described above.

The present invention may also include embodiments in which the boot PROMs are programmed in parallel. In this scenario, for the configuration illustrated in FIGS. 7 and 8, an exemplary ERASE operation, which normally may take approximately 30 seconds to perform for each device, may proceed as follows: First, the SPI_Program_enable_bit is loaded into the CONFIG register to enable programming of boot PROM 614-1, and a BYPASS instruction is loaded into FPGAs 612-2 and 612-3. The state machine steps through to the Shift-DR state to send the ERASE command to SPI FLASH 620-1 of boot PROM 620-1 through the TDI connection. The state machine steps through to the Exit-DR state to drive the /CS signal of SPI FLASH 620-1 high to start the ERASE procedure. Next, the state machine steps through to the Shift-IR state to load the BYPASS instruction into FPGA 612-1, the SPI_Program_enable_bit into FPGA 612-2, and the BYPASS instruction into 612-3. The /CS connection of SPI FLASH 620-1 remains high, and the ERASE operation continues. The state machine steps through to the Shift-DR state to load the ERASE command to SPI FLASH 620-2 through the BYPASS register of FPGA 612-1. The state machine steps through to the Exit-DR state to drive the /CS pin of SPI FLASH 620-2 high to start the ERASE procedure. At this moment, both SPI FLASH devices 620-1 and 620-2 are being erased in parallel. Next, the ERASE STATUS command is loaded into SPI flash 620-2 to determine whether the ERASE procedure is complete. If not, then the procedure loops back to repeatedly load ERASE STATUS commands into SPI flash 620-2 until the ERASE procedure is complete. Next, the state machine steps through to the Shift-IR state to load the SPI_Program_enable_bit into FPGA 612-1 and a BYPASS instruction to FPGAs 612-2 and 612-3. The state machine steps through to the Shift-DR state. Next, the ERASE STATUS command is loaded into SPI flash 620-1 to determine whether the ERASE procedure is complete. If not, then the procedure loops back to repeatedly load ERASE STATUS commands into SPI flash 620-1 until the ERASE procedure is complete. Accordingly, if SPI flash PROMs 620-1 and 620-2 have erase times of 20 and 30 seconds, respectively, then the resultant erase time will be 30 seconds when performed in parallel, rather than 50 seconds when performed sequentially. Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device that requires configuration data.

Although the present invention has been described in the context of embodiments in which serial PROMs are used to store configuration data, in other embodiments, other types of memory devices can be used, including (1) other types of serial memory devices, such as serial random access memory (RAM) devices, and (2) even non-serial memory devices. For example, in theory, the present invention could be implemented using two or more parallel memory devices to store configuration data, where each memory device has two (or more) parallel output data pins that get connected directly to a corresponding number of pins on the programmable device being configured. Moreover, data loaded into a PROM or similar device in alternative embodiments of the invention may include data other than configuration data. It should also be understood that memory devices used with the present invention may have functions other than as boot devices, and that data transferred between one or more of: external devices, programmable devices, and memory devices may include types of data other than programmable device configuration information.

While embodiments of the present invention are described herein as employing devices and interfaces compliant with SPI and JTAG standards, devices and interfaces employed in alternative embodiments may comply with standards other than SPI and JTAG, wherein a first interface is compliant with a first standard, a second interface is compliant with a second standard, and the second interface is non-compliant with the first standard.

It should be understood that the steps of the exemplary methods of programming the SPI flash of boot PROMs using FPGAs, as set forth herein, are not necessarily required to be performed in the order described, and the order of the steps of such methods should be understood to be merely exemplary. Likewise, additional steps may be included in such methods, and certain steps may be omitted or combined, in programming methods consistent with various embodiments of the present invention.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A programmable logic device comprising:
    a programmable fabric;
    a first interface compliant with a first standard and operable to receive configuration data for programming the fabric;
    a second interface compliant with a second standard and operable to receive and transmit configuration data for programming the fabric; and
    dedicated circuitry coupled to the first and second interfaces and operable to transfer configuration data received at the first interface in accordance with the first standard to the second interface for transmission therefrom in accordance with the second standard, the dedicated circuitry including:
        a multiplexer having a first input terminal coupled to the first interface, a second input terminal coupled to the programmable fabric, an output terminal coupled to the second interface, and a selection terminal coupled to receive a control signal from the first interface; and
        a demultiplexer having an input terminal coupled to the second interface, a first output terminal coupled to transmit signals to the first interface, a second output terminal coupled to the programmable fabric, and a selection terminal coupled to receive a control signal from the first interface.

2. The programmable logic device of claim 1, wherein the first interface is a JTAG interface compliant with the JTAG standard.

3. The programmable logic device of claim 1, wherein the second interface is a SPI interface compliant with the SPI standard.

4. The programmable logic device of claim 1, wherein the programmable logic device is part of an electronic system that also includes an external device coupled to the second interface of the programmable logic device, the external device having an interface compliant with the second standard.

5. The programmable logic device of claim 4, wherein the external device is a memory device.

6. The programmable logic device of claim 1, wherein the second interface is non-compliant with the first standard.

7. The programmable logic device of claim 1, wherein:
    responsive to a first state of the control signal, the multiplexer is operable to transfer configuration data from the first interface to the second interface and the demultiplexer is operable to transfer a signal from the second interface to the first interface; and responsive to a second state of the control signal, the demultiplexer is operable to transfer configuration data from the second interface to the programmable fabric and the multiplexer is operable to transfer a signal from the programmable fabric to the second interface.

8. The programmable logic device of claim 1, wherein the dedicated circuitry includes a second multiplexer having a first input terminal coupled to the first output terminal of the demultiplexer, a second input terminal coupled to the programmable fabric, an output terminal coupled to the first interface, and a selection terminal coupled to receive a control signal from the first interface.

9. The programmable logic device of claim 8, wherein the programmable fabric is operable to receive configuration data from the first interface and, responsive to the control signal, the second multiplexer is operable to transfer a signal from the programmable fabric to the first interface.

10. The programmable logic device of claim 1, wherein the programmable logic device is an FPGA.

11. A method of programming a memory device with configuration data for a programmable logic device, comprising:
   transmitting configuration data to a first interface of the programmable logic device, the first interface compliant with a first standard;
   transferring the configuration data from the first interface through a multiplexer controllable by the first interface to a second interface of the programmable device without configuring the programmable logic device to couple the interfaces, the second interface compliant with a second standard; and
   transmitting the configuration data from the second interface of the programmable logic device to an interface of the memory device, the memory device interface compliant with the second standard.

12. The method of claim 11, wherein the memory device is a PROM.

13. The method of claim 11, wherein the configuration data is transmitted to the first interface of the programmable logic device by automated test equipment transmits.

14. The method of claim 11, wherein the first interface is a JTAG interface compliant with the JTAG standard.

15. The method of claim 11, wherein the second interface is a SPI interface compliant with the SPI standard.

16. The method of claim 11, wherein the memory device is a first memory device and the programmable logic device is a first programmable logic device, the method comprising:
   transmitting configuration data through the first programmable logic device to a first interface of a second programmable logic device, the first interface compliant with a first standard;
   transferring the configuration data from the first interface to a second interface of the second programmable device without configuring the programmable fabric to couple the interfaces, the second interface compliant with a second standard; and
   transmitting the configuration data from the second interface of the second programmable logic device to an interface of a second memory device, the second memory device interface compliant with the second standard.

17. The method of claim 16, wherein the first and second programmable logic devices are connected in a daisy chain.

18. A programmable logic device comprising:
   a programmable fabric;
   a JTAG port operable to receive configuration data for programming the fabric;
   a SPI port operable to receive and transmit configuration data for programming the fabric; and
   circuitry coupled to the JTAG and SPI ports and operable, without being configured, to transfer configuration data received at the JTAG port to the SPI port, the circuitry including a multiplexer having a first input terminal coupled to the first interface, a second input terminal coupled to the programmable fabric, an output terminal coupled to the second interface, and a selection terminal coupled to receive a control signal from the first interface.

19. The programmable logic device of claim 18, wherein the programmable logic device is part of an electronic system that also includes a SPI flash memory device coupled to the SPI port of the programmable logic device.

20. The programmable logic device of claim 18 including a demultiplexer having an input terminal coupled to the second interface, a first output terminal coupled to transmit signals to the first interface, a second output terminal coupled to the programmable fabric, and a selection terminal coupled to receive a control signal from the first interface.

* * * * *